(12) United States Patent
Kim et al.

(10) Patent No.: US 8,633,568 B2
(45) Date of Patent: Jan. 21, 2014

(54) MULTI-CHIP PACKAGE WITH IMPROVED SIGNAL TRANSMISSION

(75) Inventors: Young Won Kim, Icheon-si (KR); Jun Ho Lee, Icheon-si (KR); Hyun Seok Kim, Icheon-si (KR); Boo Ho Jung, Icheon-si (KR); Sun Ki Cho, Icheon-si (KR); Yang Hee Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 48 days.

(21) Appl. No.: 12/983,211

(22) Filed: Dec. 31, 2010

(65) Prior Publication Data

US 2011/0210419 A1 Sep. 1, 2011

(30) Foreign Application Priority Data

Feb. 26, 2010 (KR) .......................... 10-2010-0017458

(51) Int. Cl.
*H01L 27/08* (2006.01)

(52) U.S. Cl.
USPC .... 257/531; 257/421; 257/686; 257/E21.022; 257/E27.07; 336/200; 336/205; 336/206; 336/225; 336/232; 336/180; 336/185

(58) Field of Classification Search
USPC .................. 257/531, 686, 421–427, E21.022, 257/E27.07; 336/200, 206, 205, 232, 225, 336/180, 185
See application file for complete search history.

(56) References Cited

U.S. PATENT DOCUMENTS

| 5,839,184 | A | 11/1998 | Ho et al. | |
|---|---|---|---|---|
| 8,212,155 | B1* | 7/2012 | Wright et al. .................. | 174/263 |
| 2003/0094944 | A1* | 5/2003 | Suzuki et al. .................. | 324/252 |
| 2008/0213966 | A1 | 9/2008 | Lee | |
| 2009/0115411 | A1* | 5/2009 | Sun et al. ....................... | 324/242 |
| 2009/0134489 | A1* | 5/2009 | Chiozzi .......................... | 257/531 |
| 2009/0243035 | A1* | 10/2009 | Mashino ........................ | 257/531 |
| 2010/0033236 | A1* | 2/2010 | Triantafillou et al. ........ | 327/540 |

FOREIGN PATENT DOCUMENTS

| JP | 11-177027 | 2/1999 |
|---|---|---|
| JP | 2000-124388 | 4/2000 |
| JP | 2000-316728 | 11/2000 |

* cited by examiner

*Primary Examiner* — Kimberly Rizkallah
*Assistant Examiner* — Maria Ligai
(74) *Attorney, Agent, or Firm* — William Park & Associates Patent Ltd.

(57) ABSTRACT

Provided is an MCP including a plurality chips stacked therein. Each of the chips includes a plurality of inductor pads configured to transmit power or signals, and at both sides of a reference inductor pad, a first and a second inductor pads are formed to generate magnetic fluxes in different directions from each other.

5 Claims, 4 Drawing Sheets

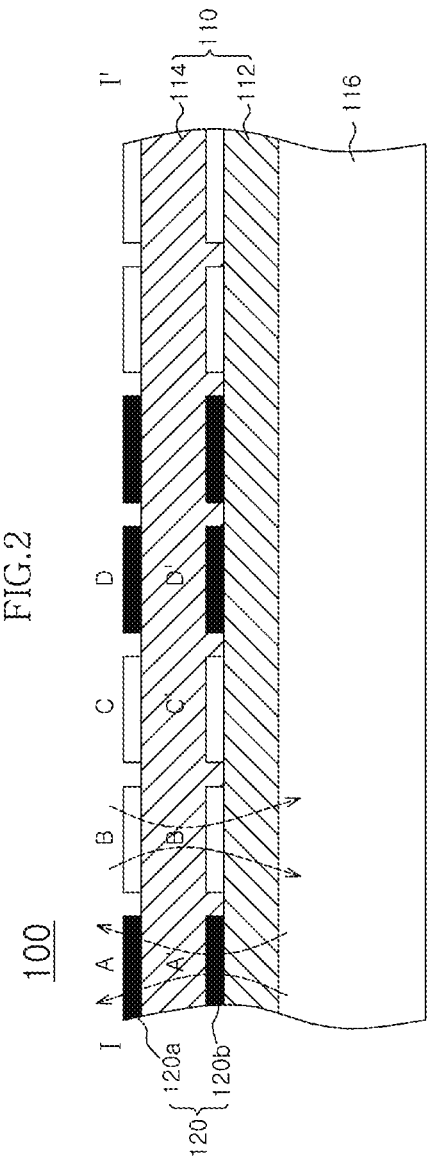
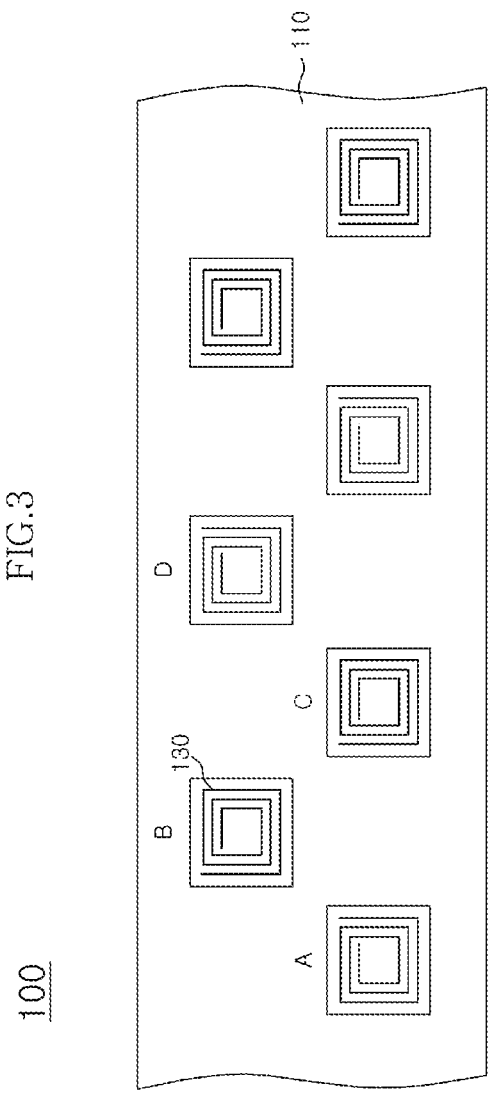

Magnetic Flux Direction

Magnetic Flux Direction

MULTI-CHIP PACKAGE WITH IMPROVED SIGNAL TRANSMISSION

REFERENCES TO RELATED APPLICATION

The present application claims priority under 35 U.S.C. §119(a) to Korean application number 10-2010-0017458, filed on Feb. 26, 2010, in the Korean Intellectual Property Office, which is incorporated herein by reference in its entirety.

BACKGROUND

1. Technical Field

The present invention relates to a semiconductor integrated circuit, and more particularly, to a multi-chip package (MCP).

2. Related Art

An MCP is a package for a plurality of chips, and may be used for combining a memory chip with non-memory chips depending on an application product. MCP contributes to increasing the area efficiency for mobile devices such as a mobile phone.

There are a variety of methods for manufacturing the MCP. For example, in a 3D stacking method, the plurality of chips are vertically stacked, and electrically coupled to each other by through silicon vias (TSVs).

Since the MCP manufactured using the 3D stacking method does not require a metal wire for coupling the chips, miniaturization, high speed, and low power consumption may be realized. Accordingly, the demand for the MCP is increasing. However, when the TSVs are used, signal distortion may occur.

Therefore, in order to solve the problem of the 3D stacking method, inductor pads capable of performing wireless transmission may be formed over a plurality of chips such that signal transmission between the respective chips can be performed.

However, in the case of the MCP including the inductor pads, the distance between the respective inductor pads is too small. Therefore, it is difficult to prevent the signal interference, and the resulting distortion, due to adjacent inductor pads. Furthermore, the signal transmission speed may decrease.

SUMMARY

An MCP capable of improving signal transmission speed between stacked packages is described herein.

In one embodiment of the present invention, there is provided an MCP including a plurality chips stacked therein. Each of the chips includes a plurality of inductor pads configured to transmit power or signals, and at both sides of a reference inductor pad, which is not an end inductor pad, a first and a second inductor pads are formed so as to generate magnetic fluxes in different directions from each other.

In another embodiment of the present invention, there is provided an MCP including a plurality of chips stacked therein. Each of the chips includes a plurality of inductor pads configured to wirelessly transmit power or signals, and the inductor pads include a first inductor pad formed at one side of a reference inductor pad and configured to generate magnetic fluxes in the same direction as the reference inductor pad and a second inductor pad formed at the other side of the reference inductor pad and configured to generate magnetic fluxes in a different direction from that of the reference inductor pad.

In still another embodiment of the present invention, there is provided an MCP including a plurality of chips stacked therein. Each of the chips includes a plurality of inductor pads which are sequentially grouped in pairs, and one pair of inductor pads generates magnetic flux in a different direction than an adjacent pair of inductor pads.

BRIEF DESCRIPTION OF THE DRAWINGS

Features, aspects, and embodiments are described in conjunction with the attached drawings, in which:

FIG. 2 is a cross-sectional view of the MCP according to an embodiment of the invention;

FIG. 3 is a plan view of an inductor pad of an MCP according to another embodiment of the invention;

DETAILED DESCRIPTION

Hereinafter, a multi-chip package (MCP) according to the present invention will be described below with reference to the accompanying drawings through exemplary embodiments.

Figure 1:
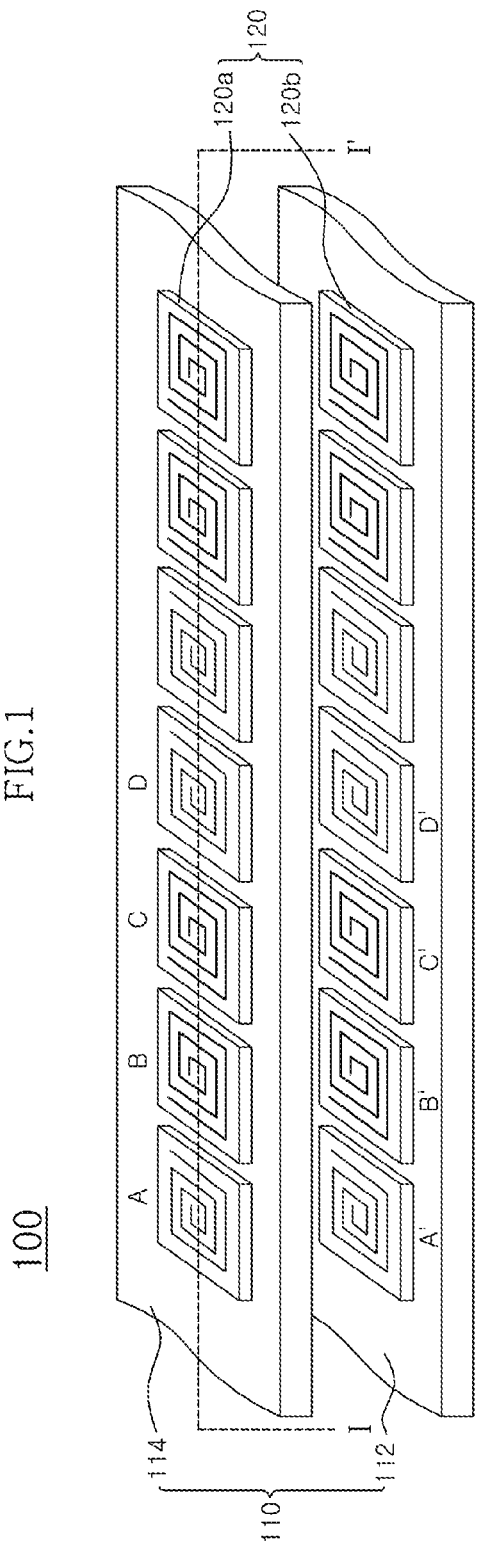
FIG. 1 is a perspective view of an MCP according to one embodiment of the invention.

FIG. 1 is a perspective view of an MCP according to one embodiment of the invention. FIG. 2 is a cross-sectional view of the MCP according to an embodiment of the invention.

Referring to FIGS. 1 and 2, the MCP 100 according to the embodiment includes a plurality of chips 110 and a plurality of inductor pads 120.

The chips 110 include an upper chip 114 and a lower chip 112 which are sequentially stacked on a substrate 116 as illustrated in FIG. 2. The upper chip 114 and the lower chip 116 may be different types of chips or the same type of chips.

The upper and lower chips 114 and 116 include upper chip and lower chip inductor pads 120a and 120b which are respectively formed at the corresponding positions so as to have the same current and magnetic flux direction.

On the other hand, the inductor pads formed on each of the upper and lower chips 114 and 116 may have different current and magnetic flux directions with respect to each other. More specifically, the upper chip inductor pads 120a are formed on the upper chip 114, and the lower chip inductor pads 120b are formed on the lower chip 112.

In this embodiment, a stacking method including the upper and lower chips 114 and 112 is used. Without being limited thereto, however, a stacking method in which three or more chips are stacked may also be used.

In order to drive the upper and lower chips 114 and 112, a plurality of signals are required. The signals may be inputted from outside the upper and lower chips 112 and 114, or internally generated in the upper and lower chips 114 and 112.

The inductor pads 120 serve to transmit signals or power between the upper and lower chips 114 and 112. The inductor pads 120 may be arranged in line on the upper and lower chips 114 and 112, respectively. The arrangement of the inductor pads 120 is not limited to that described in this embodiment. For example, the inductor pads 120 may be arranged in a zigzag shape as illustrated in FIG. 3. Other arrangements may also be used as appropriate.

As described above, the inductor pads 120 include the upper chip inductor pads 120a formed on the upper chip 114 and the lower chip inductor pads 120b formed on the lower chip 112.

The upper chip inductor pads 120a include inductor pads A and D that may be configured to transmit signals or power toward the upper chip 114 from the lower chip 112 and inductor pads B and C that may be configured to transmit signals or power toward the lower chip 112 from the upper chip 114.

The lower chip inductor pads 120b include inductor pads A' and D' which are formed at positions corresponding to the inductor pads A and D, and inductor pads B' and C' which are formed at positions corresponding to the inductor pads B and C.

The upper chip and lower chip inductor pads 120a and 120b are sequentially arranged in groups on the respective chips. For example, three upper inductor pads 120a may be set as one group.

First, when it is assumed that the inductor pads A, B, and C are set as one group, the inductor pad A formed at one side of the inductor pad B may have a coil which passes a current in a different direction from the inductor pad B, and the inductor pad C formed at the other side of the inductor pad B may have a coil which passes a current in the same as the inductor pad B.

Figure 4A:
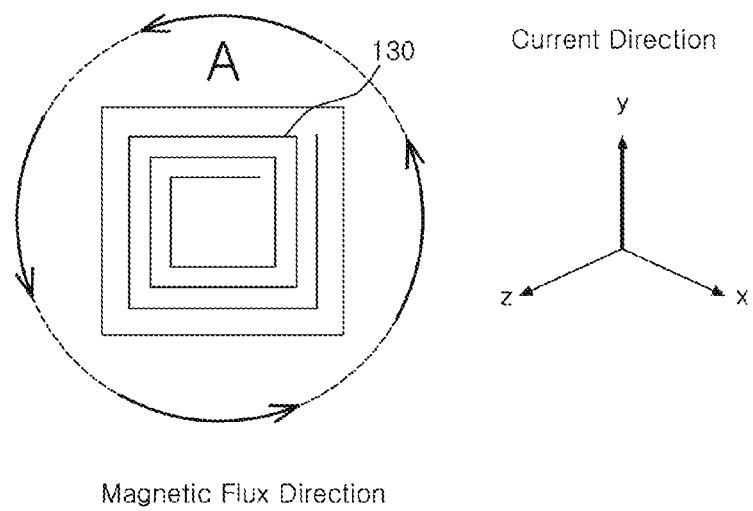
FIGS. 4A and 4B are diagrams illustrating the magnetic flux and current directions of inductor pads of the MCP according to an embodiment of the invention.

Referring to FIG. 4A, there is shown an object A, which may be indicative of the inductor pad A, that includes a coil 130 spirally wound in the counterclockwise direction. At this time, the direction of magnetic fluxes generated in the inductor pad A exhibits an inductance property according to the direction of the coil 130, that is, the inductance formation principle. Therefore, if the current in the inductor pad A flows in a counterclockwise direction, the magnetic flux generated due to the inductor pad A is in a y direction.

Figure 4B:
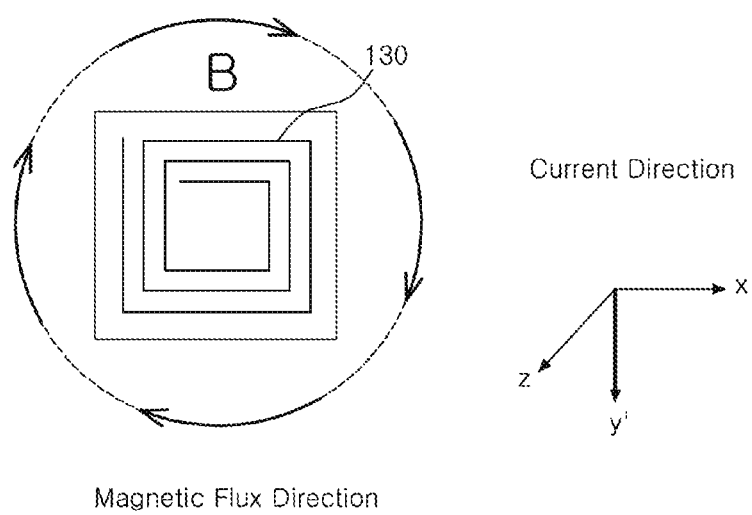

Referring to FIG. 4B, there is shown an object B, which may be indicative of the inductor pads B and C, that may include a coil 130 spirally wound in the clockwise direction. Accordingly, if the current flow in the inductor pads B and C in the clockwise direction according to the direction of the coil 130, the magnetic flux generated due to the inductor pads B and C may be in a y' direction, where y' direction is opposite to y direction.

When the inductor pad A and the inductor pad C are formed in such a manner as to have different magnetic flux directions, the magnetic fluxes of the inductor pads A and C are offset by each other, and the inductor pad B formed between the inductor pads A and C may transmit a signal in a desired direction, where interference by signals from the inductor pads A and C may be minimized.

Figure 5A:
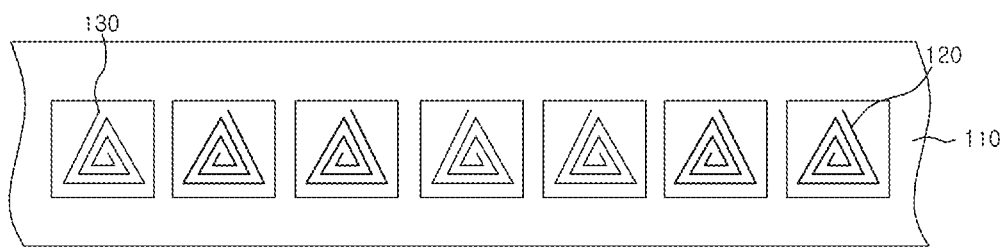
FIGS. 5A and 5B are diagrams illustrating the shapes of coils provided on the inductor pads of the MCP according to an embodiment of the invention.
Figure 5B:
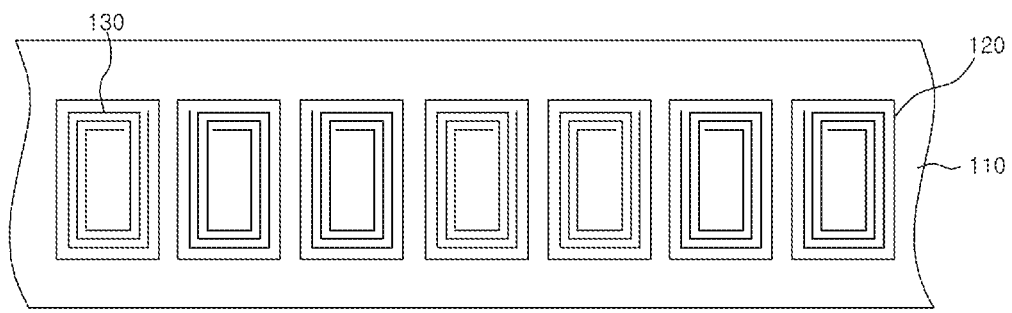

In this embodiment, the coils 130 of the inductor pads A, B, and C are spirally wound in a square shape. Without being limited thereto, however, the coils 130 may be spirally wound in a triangle shape as illustrated in FIG. 5A or spirally wound in a rectangular shape as illustrated in FIG. 5B. The coil 130 may be wound in any geometric shape, such as polygon or circle, as appropriate.

When it is assumed that inductor pads B, C, and D are set as one group, the inductor pad B formed at one side of the inductor pad C has a coil which passes a current in the same direction as the inductor pad C, and the inductor pad D formed at the other side of the inductor pad C has a coil which passes a current in a different direction from the C inductor pad.

When the inductor pads B and D are formed in such a manner as to have different magnetic flux directions, the magnetic fluxes of the inductor pads B and D are offset by each other, and the inductor pad C formed between the inductor pads B and D may transmit a signal in a desired direction without an influence of the inductor pads B and D.

In this embodiment, when any one inductor pad is assumed to be a reference inductor pad, a first inductor pad is formed at one side of the reference inductor pad so as to generate magnetic flux in the same direction as the reference inductor pad, and a second inductor pad is formed at the other side of the reference inductor pad so as to generate magnetic flux in a different direction from the reference inductor pad.

That is, when the first and second inductor pads having different properties are formed at both sides of the reference inductor pad, the magnetic fluxes may be offset. Then, the reference inductor pad may alleviate undesired signal interference of the first and second inductor pads. Furthermore, the signal distortion may be reduced, and the efficiency of wireless transmission may be improved.

It may be noted that end inductor pads may not have a pair of inductor pads associated with them. For example, an end inductor pad on the left hand side may not have another inductor pad to the left of it. Similarly, an end inductor pad on the right hand side may not have another inductor pad to the right of it. Accordingly, an embodiment of the invention may select the end inductor pads for signals and/or power that may not be susceptible to noise or interference.

While certain embodiments have been described above, it will be understood to those skilled in the art that the embodiments described are by way of example only. Accordingly, the MCP described herein should not be limited based on the described embodiments. Rather, the MCP described herein should only be limited in light of the claims that follow when taken in conjunction with the above description and accompanying drawings.

What is claimed is:

1. A multi-chip package (MCP) having a plurality of chips comprising:
  a lower substrate;
  a first main inductor pad configured to form on the lower substrate;
  a first lower inductor pad configured to form on the lower substrate, wherein the first lower inductor pad is formed at one side of the first main inductor pad;
  a second lower inductor pad configured to form on the lower substrate, wherein the second lower inductor pad is formed at the other side of the first main inductor pad and to include a magnetic flux to offset a magnetic flux of the first lower inductor pad;
  an upper substrate configured to dispose over the lower substrate;
  a second main inductor pad configured to form on the upper substrate to overlap with the first main inductor pad and to generate a magnetic flux having a same direction with a magnetic flux of the first main inductor pad;
  a first upper inductor pad configured to form on the upper substrate, wherein the first upper inductor pad is formed at one side of the second main inductor pad; and
  a second upper inductor pad configured to form on the upper substrate, wherein the second upper inductor pad is formed at the other side of the second main inductor and to include a magnetic flux to offset a magnetic flux of the first upper inductor pad.

2. The MCP according to claim 1, wherein the first main inductor pad, the first lower inductor pad, the second lower inductor pad, the second main inductor pad, the first upper inductor pad and the second upper inductor pad comprise a winding coil, respectively.

3. The MCP according to claim 2, wherein a winding direction of the first main inductor pad is substantially similar to that of the second main inductor pad.

4. The MCP according to claim 2, wherein a winding direction of the first lower inductor pad is substantially similar to that of the first upper inductor pad, and the first upper inductor pad overlaps with the first lower inductor pad.

5. The MCP according to claim 2, wherein a winding direction of the second lower inductor pad is substantially similar to that of the second upper inductor pad, and the second upper inductor pad overlaps with the second lower inductor pad.

\* \* \* \* \*